(12) United States Patent
Wiklund et al.

(10) Patent No.: US 7,054,609 B2
(45) Date of Patent: May 30, 2006

(54) LINEARITY IMPROVEMENT OF GILBERT MIXERS

(75) Inventors: Magnus Wiklund, Lund (SE); Sven Mattisson, Bjärred (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 409 days.

(21) Appl. No.: 10/400,114

(22) Filed: Mar. 26, 2003

(65) Prior Publication Data

US 2003/0236083 A1 Dec. 25, 2003

Related U.S. Application Data

(63) Continuation-in-part of application No. 10/383,370, filed on Mar. 6, 2003, now Pat. No. 6,891,423.

(60) Provisional application No. 60/370,322, filed on Apr. 4, 2002.

(51) Int. Cl.
*H04B 1/26* (2006.01)
*H04B 1/28* (2006.01)

(52) U.S. Cl. ............... 455/323; 455/333; 455/341; 327/113; 327/358; 327/363

(58) Field of Classification Search .............. 455/108, 455/118, 127.2, 127.3, 131, 205, 232.1, 234.1, 455/313, 334, 341, 323, 333; 327/105, 113, 327/355, 356, 358, 363; 375/329, 345
See application file for complete search history.

(56) References Cited

U.S. PATENT DOCUMENTS

| | | |
|---|---|---|
| 3,864,751 A | 2/1975 | Beaulieu et al. |
| 4,639,806 A | 1/1987 | Kira et al. |
| 4,663,685 A | 5/1987 | Tsang |
| 4,931,746 A * | 6/1990 | Trankle et al. ............... 327/105 |
| 5,108,037 A | 4/1992 | Okamoto et al. |
| 5,155,724 A | 10/1992 | Edwards |
| 5,179,731 A | 1/1993 | Tränkle et al. |
| 5,311,086 A | 5/1994 | Yamaji et al. |
| 5,410,743 A | 4/1995 | Seely et al. |
| 5,570,056 A | 10/1996 | Groe |
| 5,589,791 A | 12/1996 | Gilbert |
| 5,689,814 A * | 11/1997 | Hagisawa et al. .......... 455/341 |
| 6,026,287 A | 2/2000 | Puechberty et al. |
| 6,037,825 A | 3/2000 | Kung |

(Continued)

FOREIGN PATENT DOCUMENTS

DE 195 23 433 A1 1/1997

(Continued)

OTHER PUBLICATIONS

Abidi, A,, "CMOS Wireless Transceivers: The New Wave", IEEE Communications Magazine, vol. 37, No. 8, pp. 119-124.

(Continued)

*Primary Examiner*—Quochien B. Vuong

(57) ABSTRACT

Method and system are disclosed for providing an improved linearity Gilbert mixer. The Gilbert mixer of the present invention includes a conventional mixer core coupled to a high linearity, multistage amplifier. The multistage amplifier includes two or more transistor stages connected together in a global feedback arrangement. The global feedback provides a greater loop gain for the amplifier than the local feedback arrangement, thereby increasing the linearity of the amplifier. In addition, having more than one transistor stage in the amplifier serves to increase the isolation of the RF input signal from the LO input signal. Furthermore, by providing parallel output stages in the multistage amplifier, several mixer cores may be driven from the same source while sharing the feedback mechanism.

17 Claims, 4 Drawing Sheets

U.S. PATENT DOCUMENTS

| | | | |
|---|---|---|---|
| 6,054,889 | A | 4/2000 | Kobayashi |
| 6,226,509 | B1 | 5/2001 | Mole et al. |
| 6,304,142 | B1 | 10/2001 | Madni |
| 6,429,697 | B1 * | 8/2002 | Amazeen et al. ............ 327/363 |
| 6,693,980 | B1 * | 2/2004 | Linder et al. ................ 375/329 |
| 6,763,228 | B1 * | 7/2004 | Prentice et al. ........... 455/234.1 |
| 2001/0001543 | A1 | 5/2001 | Sasaki |
| 2001/0027095 | A1 | 10/2001 | Wang |
| 2001/0036818 | A1 | 11/2001 | Dobrovotny |
| 2002/0008983 | A1 | 1/2002 | Souto-Diez et al. |

FOREIGN PATENT DOCUMENTS

| | | |
|---|---|---|
| DE | 198 19 092 A 1 | 11/1999 |
| EP | 0 942 526 A1 | 9/1999 |
| EP | 1 137 168 A2 | 9/2001 |
| GB | 2 249 679 A | 5/1992 |
| GB | 2 341 502 A | 3/2000 |
| WO | WO 98/47221 | 10/1998 |

OTHER PUBLICATIONS

Butler, N., International Search Report completed by European Patent Office on Nov. 27, 2003 (7 pages).

Ratajski, A. International Search Report completed by European Patent Office on Dec. 5, 2003 (6 pages).

Wiklund, et al., "A 2GHz Image-Reject Receiver in a Low IF Architecture Fabricated in a 0.1um CMOS Technology", ESSCIRC, Apr. 4, 2002, pp. 1-4.

* cited by examiner

LINEARITY IMPROVEMENT OF GILBERT MIXERS

CROSS-REFERENCE TO RELATED APPLICATION

This application for patent claims the benefit of priority from, and hereby incorporates by reference, U.S. Provisional Patent Application Ser. No. 60/370,322, entitled "Linearity Improvement of Gilbert Mixers," filed on Apr. 4, 2002, and is a continuation-in-part of U.S. Utility patent application Ser. No. 10/383,370, entitled "Quadrature Switching Mixer," filed on Mar. 6, 2003 now U.S. Pat. No. 6,891,423, which is hereby incorporated by reference.

BACKGROUND OF THE INVENTION

1. Field of the Invention

This invention is directed generally to radio communication systems, and more particularly to improved linearity in radio communication systems that use Gilbert mixers.

2. Description of the Related Art

In radio communication systems, a mixer is used to up-convert a baseband signal to a higher frequency (e.g., radio frequency (RF)) signal for ease of transmission. The mixer can also down-convert a high frequency signal to baseband for ease of signal processing. Various types of mixers exist, including unbalanced, single and double balanced, and the four-quadrant or Gilbert mixer. For general information regarding the various types of mixers, the reader is referred to "Radio-Frequency Microelectronic Circuits for Telecommunication Applications," Yannis E. Papananos, ISBN 0-7923-8641-8, Kluwer Academic Publishers, Boston, 1999.

The Gilbert mixer is commonly used because this mixer design provides reasonable conversion gain (i.e., intermediate frequency (IF) output power with respect to RF input power), good image rejection at the RF and local oscillator (LO) ports, and a differential IF output. FIG. 1 illustrates a circuit diagram for an exemplary Gilbert mixer 100 that can be used to down-convert a high frequency (e.g., RF) signal. As can be seen, the Gilbert mixer 100 is composed of two main sections: an amplifier 102 for receiving and amplifying the RF signal, and a mixer core 104 for mixing the RF signal with the LO signal to produce the IF signal.

The amplifier 102 includes two transistors Q1 and Q2 connected as a typical single stage (i.e., one transistor stage) amplifier. The source terminal of each transistor Q1 and Q2 is connected to a common ground $V_{ss}$ via a respective one of the feedback resistors $R_E$. The gate terminals of the two transistors Q1 and Q2 form the RF input port 106 through which the RF input signal is received. The RF input signal is then provided to the mixer core 104 via the drain terminals of the two transistors Q1 and Q2. The above single stage arrangement is also known as a "local feedback" arrangement because of the direct influence of the transistor output $i_e$ on the transistor input $v_b$:

$$v_b = v_{be} + i_e R_E \quad (1)$$

The mixer core 104 includes fours transistors Q3–Q6 connected as a typical mixer circuit. The source terminals of transistors Q3 & Q4 are connected to the drain terminal of transistor Q1. Likewise, the source terminals of transistors Q5 & Q6 are connected to the drain terminal of transistor Q2. The gate terminals of transistors Q4 & Q5 are connected together and form one end of the LO input port 108. The other end of the LO input port 108 is formed by the common gate terminals of transistors Q3 & Q6. The drain terminals of transistors Q3 & Q5 and Q4 & Q6 together form the IF output port 110. Pull-up resistors R connect the drain terminals of the transistors Q3–Q6 to the power supply.

Operation of the Gilbert mixer 100 is as follows. In the absence of any voltage difference between the gates of transistors Q1 and Q2, the drain currents $i_c$ of these two transistors are essentially equal. Thus, a voltage applied to the LO input port 108 results in no difference at the IF output port 110. Should a small DC offset voltage be present at the RF input port 106 (e.g., due to a mismatch in the transistors Q1 and Q2), this will only result in a small feed through of the LO signal to the IF output port 110, which will typically be blocked by an IF filter (not shown). Conversely, if an RF signal is applied to the RF input 110 port 106, but no voltage difference is applied to the LO input port 108, the IF output port 110 will again be balanced. A small offset voltage (due to mismatch in transistors Q3–Q6) may cause some RF signal feed through to the IF output port 110. As before, however, this will be rejected by the IF filter. Thus, it is only when a signal is supplied to both the LO input port 108 and the RF input port 106 that a signal appears at the IF output port 110.

A problem with Gilbert mixers in general is that the amplifier 102 does not achieve a sufficiently high range of linearity for modern radio communication systems. FIG. 2 is an exemplary graph showing the relationship between the RF input voltage ($V_{RF}$) and output voltage ($V_{IF}$) for the Gilbert mixer 100. As can be seen, there is essentially a linear relationship between the $V_{RF}$ and the $V_{IF}$ signals for a certain operating range, generally between points 200 and 202. This response is due primarily to the linear transconductance of the amplifier 102 over that operating range. Outside this operating range, however, the Gilbert mixer 100 becomes increasingly nonlinear. The size of the linear operating range depends mostly on the operating points of Q1 and Q2 as well as the feedback provided to the amplifier 102. Generally, an increase in the amount of feedback results in an increase in the linearity of the mixer. In FIG. 1, for example, the resistors $R_E$ provide feedback to the amplifier 102. Increasing the resistance of the feedback resistors $R_E$ will have the effect of increasing the linearity of the Gilbert mixer 100.

While the above described Gilbert mixer design can provide sufficient linearity for older systems, modern radio communication systems such as UMTS (Universal Mobile Telecommunications System) have much greater linearity requirement due to the newer modulation techniques used in combination with a reduced supply voltage. That is, modern radio communication systems such as UMTS require a larger linear operating range in the mixer. This increased linearity requirement is stretching the capability of most existing Gilbert mixer designs. Specifically, the local feedback arrangement of the single stage amplifier of existing Gilbert mixer designs cannot provide sufficient feedback to produce the linearity required by some modern radio communication systems when low supply voltages are employed.

Therefore, it is desirable to provide a Gilbert mixer that is capable of performing with a higher linearity than that of existing Gilbert mixers. In particular, it is desirable to provide a Gilbert mixer having an improved amplifier feedback that can produce the increased linearity required by modern radio communication systems.

SUMMARY OF THE INVENTION

Briefly, the present invention is directed to method and system for providing an improved linearity Gilbert mixer. The Gilbert mixer of the present invention includes a conventional mixer core coupled to a high linearity, multistage amplifier. The multistage amplifier includes two or more transistor stages connected together in a global feedback arrangement. The global feedback provides a greater loop gain for the amplifier than the local feedback arrangement, thereby increasing the linearity of the amplifier. In addition, having more than one transistor stage in the amplifier serves to increase the isolation of the RF input signal from the LO input signal. Furthermore, by providing parallel output stages in lo the multistage amplifier, several mixer cores may be driven from the same source while sharing the feedback mechanism.

In general, in one aspect, the invention is directed to a mixer circuit. The mixer circuit comprises a mixer core configured to receive an input signal and to mix the input signal with a local oscillator signal to produce a mixed output signal. The mixer circuit further comprises a multistage amplifier coupled to the mixer core and capable of amplifying the input signal, the multistage amplifier including at least a first transistor stage and a second transistor stage. A global feedback network connects the first transistor stage and the second transistor stage and is configured to provide feedback from the first transistor stage to the second transistor stage.

In general, in another aspect, the invention is directed to a method of improving linearity in a mixer circuit. The mixer circuit includes a mixer core configured to receive an input signal and to mix the input signal with a local oscillator signal to produce a mixed output signal. The method comprises the coupling a multistage amplifier to the mixer core, wherein the multistage amplifier is capable of amplifying the input signal and includes at least a first transistor stage and a second transistor stage. The method further comprises connecting a global feedback network between the first transistor stage and the second transistor stage. The feedback network is configured to provide feedback from the first transistor stage to the second transistor stage.

In general, in yet another aspect, the invention is directed to a radio communication system capable of down-converting a high frequency signal or up-converting a baseband signal. The system comprises a mixer circuit having a mixer core configured to receive an input signal and to mix the input signal with a local oscillator signal to produce a mixed output signal. A multistage amplifier is coupled to the mixer core and is capable of amplifying the input signal. The multistage amplifier includes at least a first transistor stage and a second transistor stage. A global feedback network connects the first transistor stage and the second transistor stage, and is configured to provide feedback from the first transistor stage to the second transistor stage.

In general, in still another aspect, the invention is directed to a Gilbert mixer having a mixer core configured to receive an input signal and to mix the input signal with a local oscillator signal to produce a mixed output signal. An amplifier is coupled to the mixer core and is capable of amplifying the input signal. The amplifier includes at least a first transistor stage and a second transistor stage. A global feedback network connects the first transistor stage and the second transistor stage. The feedback network is configured to provide feedback from the first transistor stage to the second transistor stage.

In general, in yet another aspect, the invention is directed to a multiphase mixer having at least a first phase mixer core and a second phase mixer core. An amplifier is coupled to the first phase mixer core and the second phase mixer core. The amplifier comprises a first stage having separate drivers for driving each mixer core a second stage for receiving an input signal. A separate global feedback network connects each driver of the first transistor stage to the second transistor stage of the amplifier. Each feedback network is configured to provide feedback from the first transistor stage to the second transistor stage.

It should be emphasized that the term comprises/comprising, when used in this specification, is taken to specify the presence of stated features, integers, steps, or components, but does not preclude the presence or addition of one or more other features, integers, steps, components, or groups thereof.

BRIEF DESCRIPTION OF THE DRAWINGS

A better understanding of the invention may be had by reference to the following detailed description when taken in conjunction with the accompanying drawings, wherein.

DETAILED DESCRIPTION OF THE INVENTION

Figure 1:
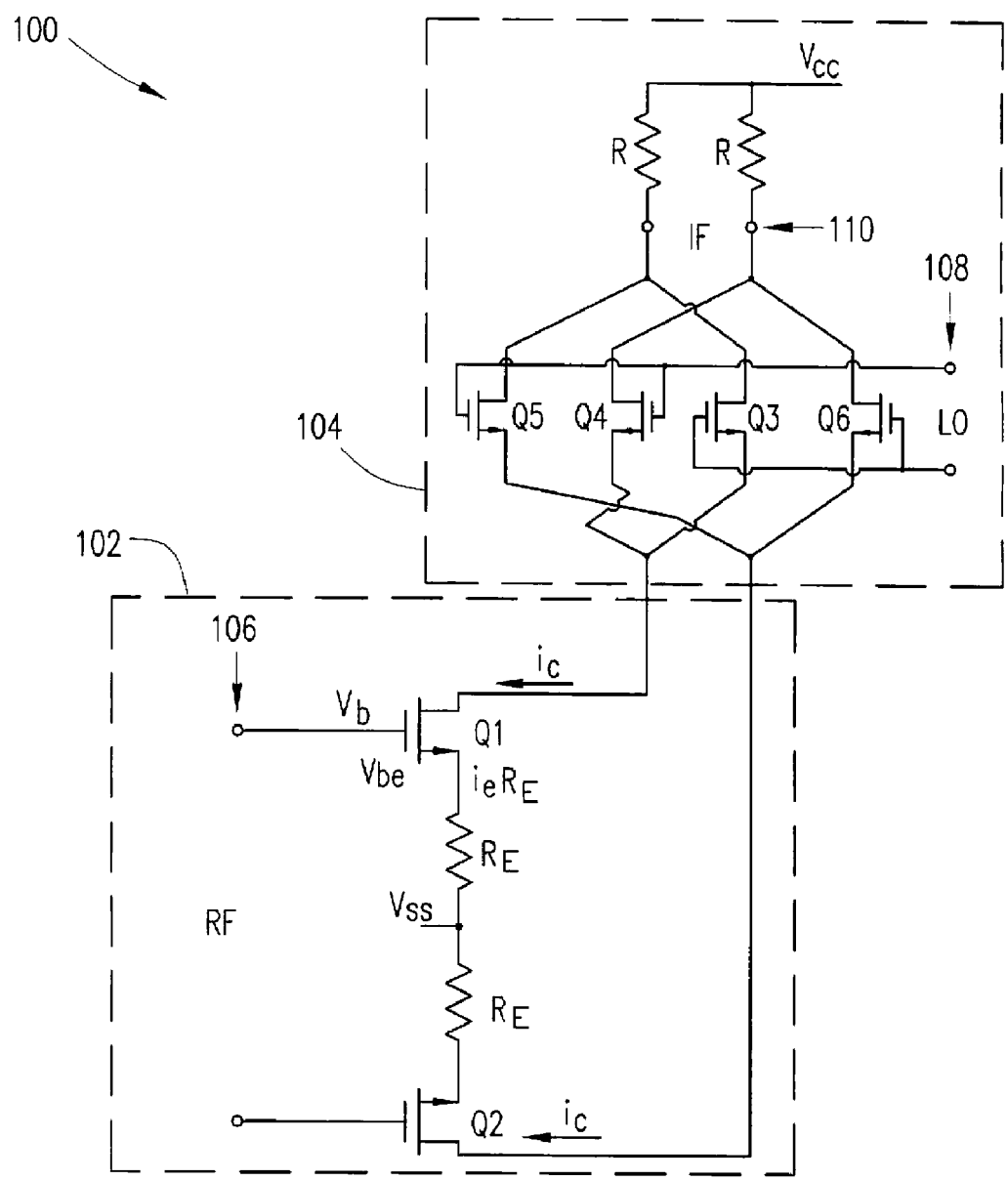
FIG. 1 is a schematic diagram of a typical Gilbert mixer.
Figure 2:
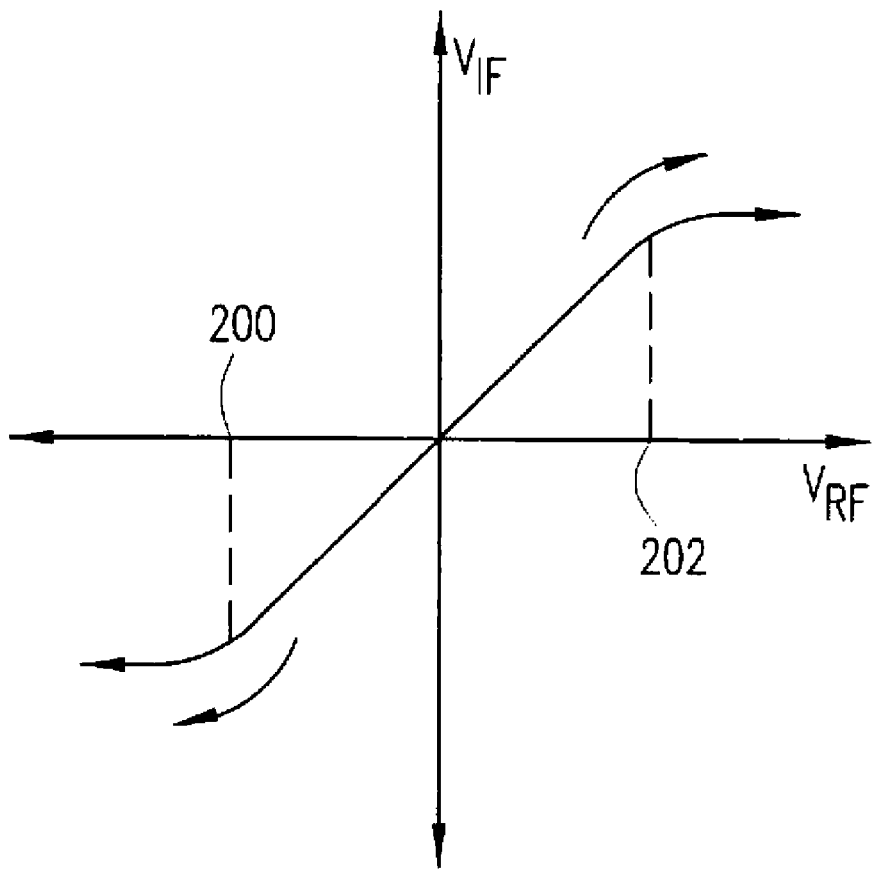
FIG. 2 is chart showing the linearity of the typical Gilbert mixer.

Following is a detailed description of the invention with reference to the drawings wherein reference numerals for the same or similar elements are carried forward. It should be noted that the transistors shown in the drawings are intended to be general in nature and do not indicate a preference for a particular type of transistor. Likewise, the equations provided herein are intended to be general in nature and do not indicate a preference for a particular type of transistor. In addition, all resistors described herein can be some other form of impedance such as capacitive (C), resistive (R), inductive (L), RC, RL, and the like. In general, the invention is capable of being implemented with any suitable type of transistor (e.g., BJT, MOS, P-MOS, N-MOS, NPN, PNP, etc.), using any suitable feedback mechanism (e.g., capacitive, resistive, inductive, RC, RL, etc.), and using any suitable biasing scheme (e.g., current source, bootstrap, resistors, LC, etc.).

Embodiments of the invention provide an improved Gilbert mixer. The Gilbert mixer of the invention includes a conventional mixer core coupled to a high linearity, multistage amplifier. The multistage amplifier includes two or more transistor stages connected together in a global feedback arrangement. The global feedback provides a greater closed-loop gain for the amplifier than the local feedback arrangement, thereby increasing the linearity of the amplifier.

A fundamental limitation of the local feedback arrangement shown in FIG. 1 is that the amount of feedback is dependent on the voltage drop across the feedback resistor $R_E$. The amount of feedback can be measured in terms of the loop gain L, a simplified expression for which can be given by:

$$L = g_m R_E, \tag{2}$$

where $g_m$ is the transconductance of the transistor (e.g., Q1 or Q2) and $R_E$ is the feedback resistor. Specifically, for bi-polar junction transistors (BJT), the transconductance $g_m$ is dependent on the collector current $I_C$ of the transistor Q1 or Q2 and the thermal voltage $V_T$ ($\approx$25 mV at room temperature) of the transistors. Thus, $g_m$ can be expressed as:

$$g_m = I_C/V_T \tag{3}$$

The equation for the loop gain L then becomes:

$$L = (I_C R_E)/V_T = V_E/V_T \tag{4}$$

As can be seen from Equation (4), the loop gain L is limited by the voltage $V_E$ across the feedback resistor $R_E$. A feedback factor F may be defined to indicate the amount of feedback provided to the amplifier in terms of the loop gain L, where F=1+L. Improving the feedback factor F results in improvement of the linearity of the Gilbert mixer. However, the amount improvement is limited due to the limitation on L by the voltage $V_E$ across the feedback resistor $R_E$. For example, assuming that in a typical case, $V_E$=0.5V, then the feedback factor is limited to a maximum of F$\approx$21. Similar results may be derived for other transistor types (e.g., MOS, etc.).

Furthermore, because the local feedback arrangement is, by design, a single stage arrangement (i.e., one transistor stage), the isolation of the RF input signal from the LO input signal may not be sufficiently high for modern radio communication systems such as UMTS.

Figure 3:
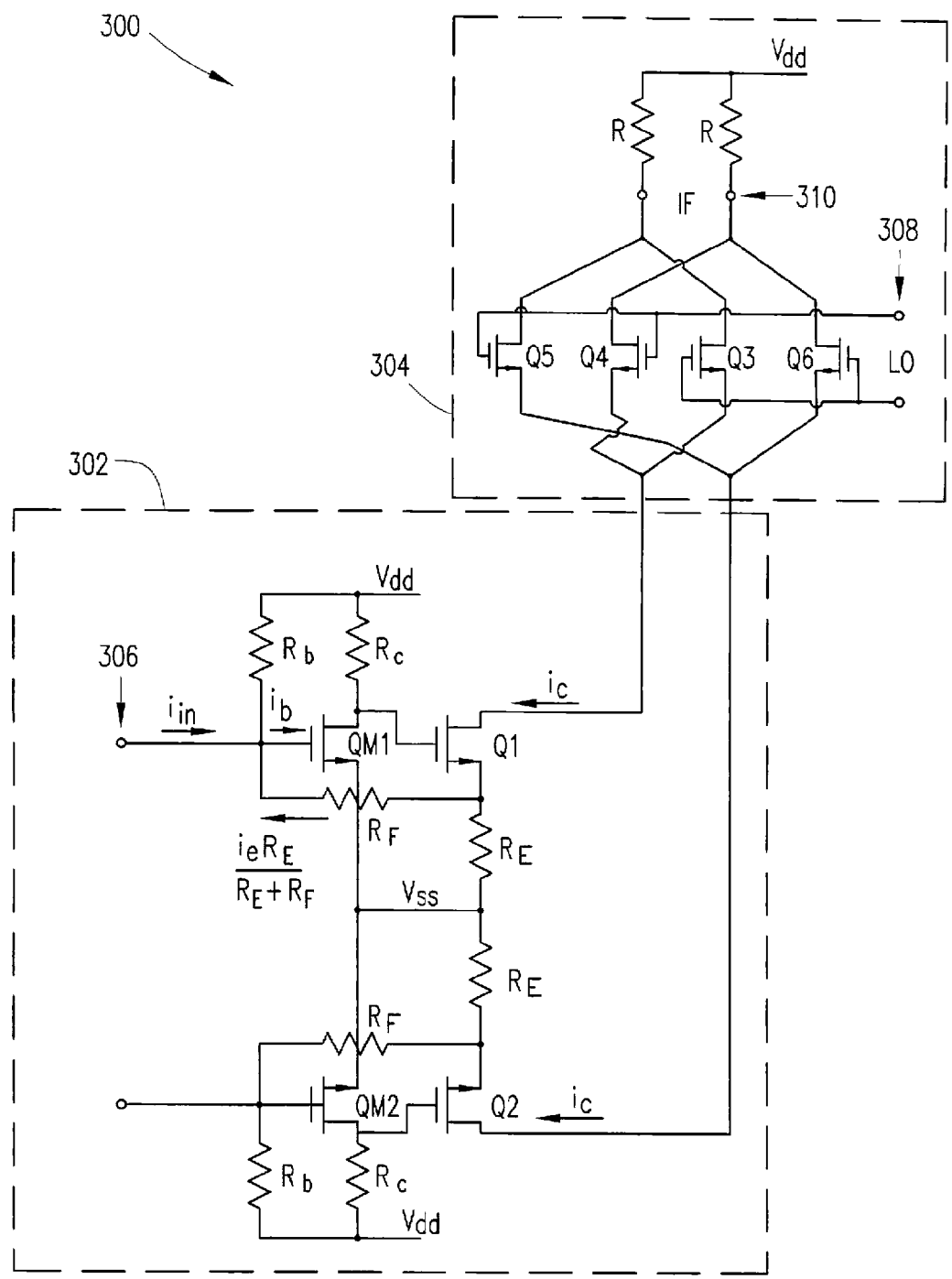
FIG. 3 is a schematic diagram of a Gilbert mixer according to embodiments of the invention.

Therefore, in accordance with embodiments of the invention, instead of a local feedback arrangement, a global feedback arrangement is used for the amplifier. Referring now to FIG. 3, a Gilbert mixer 300 according to embodiments of the invention is shown. The Gilbert mixer 300 of the present invention, like the Gilbert mixer 100 of FIG. 1, includes an amplifier 302 and a mixer core 304. The mixer core 304 is a typical mixer circuit that is substantially identical to the mixer core 104 shown in FIG. 1. The amplifier 302, on the other hand, is a multistage amplifier design that constitutes a substantial departure from existing Gilbert mixer amplifier designs.

As alluded to above, the amplifier 302 of the present invention includes at least one additional transistor stage, QM1 and QM2, connected to the existing transistors Q1 and Q2. The source terminals of the second stage transistors QM1 and QM2 are connected to the common ground $V_{ss}$. The drain terminals of the second stage transistors QM1 and QM2 are connected to the gate terminals of the first stage transistors Q1 and Q2, respectively. Pull-up resistors $R_c$ connect the drain terminals of the second stage transistors QM1 and QM2 to the power supply $V_{dd}$. The gate terminals of the second stage transistors QM1 and QM2 now form the RF input port 306. (The LO input port 308 and the IF output port 310 are formed in substantially the same manner as their counterparts in FIG. 1.) Pull-up resistors $R_b$ connect the gate terminals of the second stage transistors QM1 and QM2 to the power supply $V_{dd}$. In accordance with embodiments of the invention, feedback resistors $R_F$ connect the source terminals of the first stage transistors Q1 and Q2 to the gate terminals of the second stage transistors QM1 and QM2, respectively. The feedback resistors $R_F$ help define a global feedback across both stages of the multistage amplifier 302. Kirchoffs law applied to the node connecting $R_b$, $R_F$, the gate of QM1 and the RF input ($i_{in}$) results in the following:

$$i_{in} = i_b - R_E i_e/(R_E + R_F) \tag{5}$$

Note that in Equation (5), the feedback signal $R_E i_e/(R_E + R_F)$ is defined in terms of a current, whereas in Equation (1), the feedback signal $i_e R_E$ is defined in terms of a voltage. When the loop gain is high (i.e., L>>10), $i_b$ will become very small and the gain may be approximated as:

$$\frac{i_c}{i_{in}} \approx -\left(1 + \frac{R_F}{R_E}\right) \tag{6}$$

Operation of the amplifier 302 will now be described with respect to transistors QM1 and Q1 (which will be substantially the same for transistors QM2 and Q2). The combined loop gain for these two transistors may be defined as $L_2=\beta_2 A_i$, where $\beta_2$ is the transfer function of the current feedback-network and is, in this case, determined by the network of $R_E$ and $R_F$ (assuming the loop gain L to be high when the gate of QM1 is a virtual ground):

$$\beta_2 = \frac{R_E}{R_E + R_F} = \frac{R_E // R_F}{R_F}, \tag{7}$$

and the open-loop current gain $A_i$ for Q1 and QM1 can be expressed as:

$$A_i = (R_F // R_{iM1}) \times g_{mM1} \times (R_c // R_{i1}) \times \frac{g_m}{1 + g_m R_E}, \tag{8}$$

where $R_{i1\ and}\ R_{iM1}$ denote the input impedance looking into the input node of Q1 and QM1, respectively, and $R_c$ is the biasing impedance to the collector of QM1. From Equation (7), it can be seen that the additional loop gain $L_{M1}$ provided by QM1 is:

$$L_{M1} = \frac{(R_F // R_{iM1}) \times g_{mM1} \times (R_c // R_{i1})}{1 + g_m R_E} \tag{9}$$

This additional gain may be rewritten as $A_{M1}/F_1$, where $$A_{M1} = (R_F // R_{iM1}) \times g_{mM1} \times (R_c // R_{i1}) \tag{10}$$

and represents the gain of QM1 viewed as a transimpedance amplifier, and $F_1 = (1 + g_m R_E)$ is simply the feedback factor for Q1 (recall that the feedback factor for a one stage amplifier was defined above as F=1+L). Thus, with the proper selection of resistors, it is possible to obtain a gain that is larger than the gain obtained from single stage amplifiers such as, for example, the amplifier shown in FIG. 1. Therefore, with the use of a multistage amplifier in the Gilbert mixer, the requirement of higher linearity is easier to fulfill. Moreover, with a multistage amplifier, the isolation of the RF input signal from the LO input signal is improved as well.

It should be noted that, although a two-stage amplifier has been described, in the general case, for a multi-stage amplifier, QM may represent one or more transistors in cascade. Furthermore, although the invention has been described with respect to a down-convert application, the principles and teaching herein are equally applicable to up-convert applications.

Figure 4:
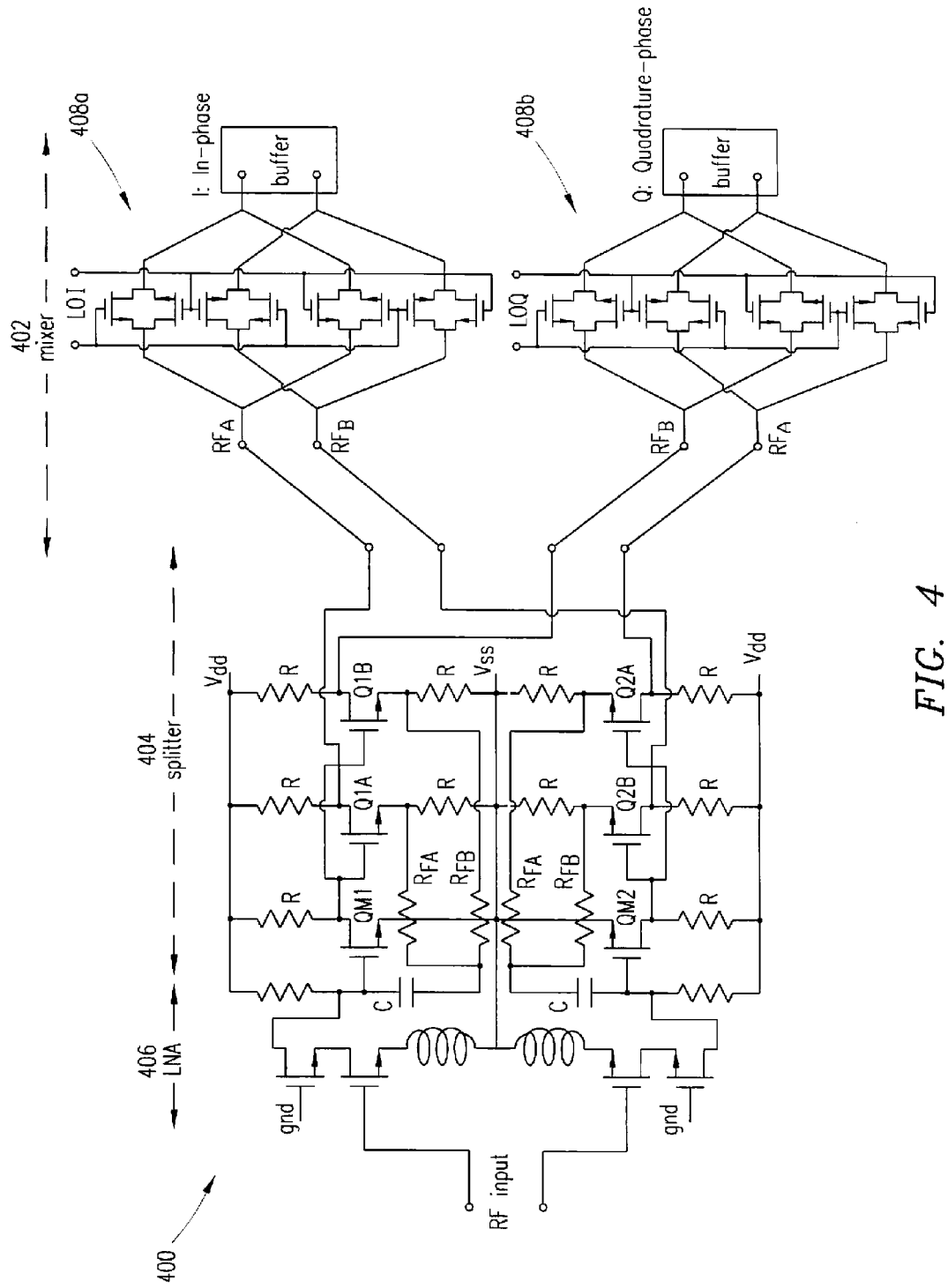
FIG. 4 is a schematic diagram of an exemplary multiphase mixer according to embodiments of the invention.

FIG. 4 illustrates an embodiment of the of the invention wherein the Gilbert mixer 300 is used to implement a quadrature mixer 400. The exemplary quadrature mixer 400 includes a mixer stage 402, a splitter stage 404, and a low noise amplifier (LNA) stage 406. For a more complete description of these stages, reference is made to U.S. Utility patent application Ser. No. 10/383,370, entitled "Quadrature Switching Mixer," filed on Mar. 6, 2003, which is incorporated herein.

As can be seen, the mixer stage 402 includes an in-phase mixer core 408a and 408b, each of which is connected to a multistage amplifier. The, in-phase mixer core 408a, for example, is connected to a multistage amplifier comprising transistors Q1A which drives the in-phase mixer core, Q1B which drives the quadrature mixer core, and QM1 which connects the RF input to the inputs of Q1A and Q1B. Likewise, the quadrature mixer core 408b is connected to a multistage amplifier comprising Q2B which drives the in-phase mixer core 408a, Q2A which drives the quadrature mixer core 408b and QM2 which connects the RF input to the inputs of Q2B and Q2A. The drain terminals of QM1 and QM2 are connected to the gate terminals of Q1A & Q1B and Q2B & Q2A, respectively. The gate terminals of QM1 and QM2 are connected, to the source terminals of Q1A & Q1B and Q2B & Q2A, respectively, through a global feedback network comprising resistors $R_{FA}$ and $R_{FB}$, respectively. In some embodiments, the global feedback network may also include a capacitive element C connected between the resistors $R_{FA}$ and $R_{FB}$ and the gate terminals of QM1 and QM2. Pull-up resistors R connect the drain terminals of each transistor in the splitter section 404 to a common power supply $V_{dd}$ as shown. Similarly, pull-down resistors R connect the source terminals of the drive transistors Q1A, Q1B, Q2B and Q2A to a common ground $V_{ss}$. The source terminals of the feedback transistors QM1 and QM2, on the other hand, are connected directly to ground.

In operation, by connecting the gates of Q1A and Q1B to the drain of QM1, the RF input signal is split evenly between Q1A and Q1A, while the feedback signals are provided by $R_{FA}$ and $R_{FB}$, which in turn recombine the feedback signals at the input of QM1. A similar result is obtained with respect to Q2B, Q2A and QM2. With this arrangement, the RE signal is evenly distributed to both mixer cores while a common global feedback is preserved. The gain balance is set by the splitting ratio or gain ratio at the inputs of Q1A and Q1B (and also Q2B and Q2A) and by the ratio $R_{FA}/R_{FB}$. In general, it is desirable to split the input RF signal substantially evenly, i.e., make the gains of Q1A and Q1B (and also Q2B and Q2A) substantially equal to each other, as well as $R_{FA}$ substantially equal to $R_{FB}$, but other configurations are possible. For example, in some embodiments, the input RF signal may not be evenly split between the driving transistors such that the splitting ratio may be different for Q1A & Q1B relative to Q2B & Q2A.

Although, the preceding paragraphs describe a quadrature mixer arrangement, in some embodiments, it is possible to use an alternative phase relationship between the two mixer cores, including the same phase and opposing phase. In other embodiments, it is also possible to accommodate more phases by adding an appropriate number of transistors, feedback resistors and mixer cores. The total available phase angle may then be evenly or substantially evenly distributed amongst the available mixer cores (e.g., 360 degrees/number of mixer cores) so that all mixer cores are offset by the same phase angle. Alternatively, only some of the mixer cores may be offset by the same phase angle, while other mixer cores are offset by different phase angles.

Thus, while particular embodiments and applications of the present invention have been illustrated and described, it is to be understood that the invention is not limited to the precise construction and compositions disclosed herein, and that modifications and variations may be made to the foregoing without departing from the scope of the invention as defined in the appended claims.

What is claimed is:

1. A mixer circuit, comprising:
a mixer core configured to receive an input signal, and to mix the input signal with a local oscillator signal to produce a mixed output signal;
a multistage amplifier coupled to the mixer core capable of amplifying the input signal received by the mixer core, the multistage amplifier including at least a first transistor stage and a second transistor stage; and
a global feedback network connecting the first transistor stage and the second transistor stage, the feedback network configured to provide feedback from the first transistor stage to the second transistor stage, thereby accurately controlling a gain of the multistage amplifier while providing a high output impedance and a low input impedance for the multistage amplifier.

2. The mixer circuit according to claim 1, wherein the feedback is a current signal provided from the first transistor stage to an input of the second transistor stage.

3. The mixer circuit according to claim 2, wherein the current signal provided to the input of the second transistor stage is a fraction of a current from the first transistor stage.

4. The mixer circuit according to claim 3, wherein the fraction of the current from the first transistor stage is determined by a ground impedance and a feedback path impedance of the first transistor stage.

5. The mixer circuit according to claim 1, wherein the multistage amplifier is in a balanced configuration comprising:
two first transistor stages coupled together by a common ground, each first transistor stage having an output that forms an input terminal for the mixer core; and
two second transistor stages coupled together by a common ground, each second transistor stage having an input that forms an input terminal for the amplifier.

6. The mixer circuit according to claim 1, wherein the first transistor stage includes at least two transistors in parallel, the at least two transistors having a common input terminal, but separate ground impedances and separate output terminals, each output terminal providing a separate copy of the input signal to the mixer core.

7. The mixer circuit according to claim 6, wherein the at least two transistors share the global feedback network.

8. The mixer circuit according to claim 1, wherein the input signal received by the mixer core is a current signal.

9. A method of improving linearity in a mixer circuit, the mixer circuit including a mixer core configured to receive an input signal and to mix the input signal with a local oscillator signal to produce a mixed output signal, the method comprising:
coupling a multistage amplifier to the mixer core, the multistage amplifier capable of amplifying the input signal received by the mixer core and including at least a first transistor stage and a second transistor stage; and
coupling a global feedback network between the first transistor stage and second transistor stage, the feedback network configured to provide feedback from first transistor stage to the second transistor stage to accurately control a gain of the multistage amplifier while providing a high output impedance and a low input impedance for the multistage amplifier.

10. The method according to claim 9, further comprising feeding back a current signal from the first transistor stage to an input of the second transistor stage.

11. The method according to claim 10, further comprising feeding back a current signal to the input of the second transistor stage that is a fraction of a current from the first transistor stage.

12. The method according to claim 11, further comprising determining the fraction of the current from the first transistor stage by a ground impedance and a feedback path impedance of the first transistor stage.

13. The method according to claim 9, further comprising balancing the multistage amplifier.

14. The method of claim 13, further comprising coupling two first transistor stages by a common ground, each first transistor stage having an output forming an input terminal for said mixer core; and coupling two second transistor stages by a common ground, each second transistor stage having an input forming an input terminal for said amplifier.

15. The method according to claim 9, further comprising configuring the first transistor stage with at least two transistors in parallel, the at least two transistors having a common input terminal, but separate ground impedances and separate output terminals, each output terminal providing a separate copy of the input signal to the mixer core.

16. The method according to claim 15, further comprising the at least two transistors sharing the global feedback network.

17. The method according to claim 9, further comprising the mixer core receiving a current signal as the input signal.

* * * * *

UNITED STATES PATENT AND TRADEMARK OFFICE
CERTIFICATE OF CORRECTION

PATENT NO. : 7,054,609 B2
APPLICATION NO. : 10/400114
DATED : May 30, 2006
INVENTOR(S) : Wiklund et al.

It is certified that error appears in the above-identified patent and that said Letters Patent is hereby corrected as shown below:

In Column 2, Line 16, after "input" delete "110".

In Column 3, Line 15, after "stages in" delete "lo".

In Column 6, Line 62, after "embodiments" delete "of the".

In Column 7, Line 5, after "mixer core 408a and" insert -- a quadrature mixer core --.

In Column 7, Line 6, delete "The," and insert -- The --, therefor.

In Column 7, Line 14, delete "408b" and insert -- 408b, --, therefor.

In Column 7, Line 18, after "connected" delete ",".

In Column 7, Line 34, delete "Q1A" and insert -- Q1B --, therefor. (second occurrence)

In Column 7, Line 37, delete "RE" and insert -- RF --, therefor.

In Column 8, Line 59, in Claim 9, after "stage and" insert -- the --.

In Column 8, Line 60, in Claim 9, after "feedback from" insert -- the --.

Signed and Sealed this

Second Day of September, 2008

JON W. DUDAS
*Director of the United States Patent and Trademark Office*